United States Patent
Mura et al.

(10) Patent No.: US 10,928,347 B2
(45) Date of Patent: Feb. 23, 2021

(54) ELECTRICAL TREE TEST METHOD, ELECTRODE STRUCTURE, AND ELECTRODE SETTING ASSEMBLY

(71) Applicant: TOSHIBA MITSUBISHI-ELECTRIC INDUSTRIAL SYSTEMS CORPORATION, Chuo-ku (JP)

(72) Inventors: Kotaro Mura, Tokyo (JP); Tetsuo Yoshimitsu, Tokyo (JP); Toshihiro Tsuda, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 352 days.

(21) Appl. No.: 16/008,525

(22) Filed: Jun. 14, 2018

(65) Prior Publication Data
US 2018/0292342 A1    Oct. 11, 2018

Related U.S. Application Data

(63) Continuation of application No. PCT/JP2015/006343, filed on Dec. 21, 2015.

(51) Int. Cl.
*G01N 27/20* (2006.01)
*G01R 31/12* (2020.01)
(Continued)

(52) U.S. Cl.
CPC .......... *G01N 27/205* (2013.01); *G01N 27/20* (2013.01); *G01R 31/12* (2013.01); *G01R 31/20* (2013.01); *H01B 3/30* (2013.01); *H01B 17/56* (2013.01)

(58) Field of Classification Search
None
See application file for complete search history.

(56) References Cited

U.S. PATENT DOCUMENTS

| 3,966,674 A * | 6/1976 | Takahashi | C08K 5/01 523/463 |
| 2009/0021272 A1* | 1/2009 | Komatsu | G01R 31/2886 324/756.03 |
| 2015/0069877 A1* | 3/2015 | Otowa | H01B 3/40 310/208 |

FOREIGN PATENT DOCUMENTS

| CN | 101004433 C | 5/2009 |
| CN | 103336011 A | 10/2013 |

(Continued)

OTHER PUBLICATIONS

Chinese Office Action dated Feb. 27, 2020 in Chinese Appiication 201580085459.9.

(Continued)

*Primary Examiner* — Jas A Sanghera
(74) *Attorney, Agent, or Firm* — Xsensus LLP (57) ABSTRACT

This electrical tree test method is a method for testing for electrical trees in an insulating member including a mica insulation applied to an electrical conductor. The method comprises: an assembly setting step of setting an electrode setting assembly to the outside of the mica insulation; an impregnation step of impregnating the mica insulation with synthetic resin after the assembly setting step; a removal step of removing components of the electrode setting assembly, except an electrode structure, after the impregnation step; a power supply connecting step of connecting, after the removal step, the electrical conductor and the electrode structure to a power supply in order to apply a voltage between the electrical conductor and the electrode structure; and a voltage applying step of applying a voltage between the electrical conductor and the electrode structure, after the power supply connecting step.

7 Claims, 11 Drawing Sheets

(51) Int. Cl.
    *G01R 31/20*     (2006.01)
    *H01B 3/30*     (2006.01)
    *H01B 17/56*     (2006.01)

(56) References Cited

FOREIGN PATENT DOCUMENTS

| | | |
|---|---|---|
| JP | 57-208006 | 12/1982 |
| JP | 09-105767 | 4/1997 |
| JP | 11-038077 | 2/1999 |
| JP | 2006-134587 | 5/2006 |
| JP | 2012-103158 | 5/2012 |
| JP | 2015-83663 A | 4/2015 |

OTHER PUBLICATIONS

International Search Report dated Apr. 5, 2016 in PCT/JP2015/006343 filed Dec. 21, 2015 (with English Translation).
Extended European Search Report dated Jul. 19, 2019 in Patent Application No. 15911251.5, citing document AX therein, 9 pages.
Brütsch, R. et al. "Insulation Failure Mechanisms of Power Generators" IEEE Electrical Insulation Magazine, vol. 24, No. 4, XP011232066, 2008, 9 Pages.

\* cited by examiner

Longitudinal direction of coil conductor

Longitudinal direction
of coil conductor

ELECTRICAL TREE TEST METHOD, ELECTRODE STRUCTURE, AND ELECTRODE SETTING ASSEMBLY

CROSS-REFERENCE TO RELATED APPLICATION

The present application is based upon and claims the benefit of priority from International Application No. PCT/JP2015/006343 filed on Dec. 21, 2015, the entire content of which is incorporated herein by reference.

FIELD

The present invention relates to an electrical tree test method of testing for electrical trees in an insulation member including a mica insulation provided around an electrical conductor, and relates to an electrode structure and an electrode setting assembly, both for use in the electrical tree test.

BACKGROUND

If a non-uniform electric field is generated at a part of the insulation and the intensity of the non-uniform electric field exceeds the dielectric strength-limit voltage when an electric field is applied to the insulation, local breakdown will occur at that part of the insulation. The local breakdown may develop, producing electrical trees.

The electrical trees are considered to start developing at highly concentrated electric fields, such as an air gap between the electrode and the insulation, foreign matter in the air gap, and foreign matter, protrusion or void existing in the insulation.

In recent years, more and more inverters have been used. Inverter-driven electric motor is used while an impulse voltage, including inverter surge, is repeatedly acting, whereby the lifetime of the coil conductor insulation may be greatly shortened.

In an exemplary insulation system for conductors used in rotating electrical machines, the coil conductor, for example, is typically covered with insulating material. The conductors that reach relatively higher temperatures are insulated with, in most cases, a mica insulation system using mica that is a kind of silicate minerals as a high-grade insulating material that can withstand relatively higher temperatures.

If the electrical tree develops, the mica insulation system will break down. It is therefore extremely important to understand how electrical trees are generated and then develop in the mica insulation system, in order to prevent the generation and development of electrical trees in the mica insulation system and to keep soundness of the rotating electrical machines. Testing of such phenomena is disclosed in Japanese Patent Application Laid-Open Publication No. HEI 11-38077.

To ensure the soundness of insulating materials, IEC (International Electrotechnical Commission) is going to prepare an international standard for new insulation testing methods for accident prevention.

In the method of insulation testing, proposed by IEC, the test piece is tested while it is being clamped between plate-like electrodes. As a result, if the test piece is dielectrically broken down, the electrical tree will also be broken, leaving no trace at all in many cases. Further, since the electrodes used are shaped like plates, their starting positions are indefinite.

Thus, the analysis of the mechanism of electrical trees is limited so long as the mica insulation systems broken are investigated. It would therefore be important to reproduce electrical trees experimentally and to observe the electrical trees in detail.

DETAILED DESCRIPTION

An object of this invention is to reproduce the behavior of the electrical trees in a mica insulation system including a mica insulation, and to confirm the behavior of the electrical trees.

According to the present invention, there is provided a electrical tree test method of testing for electrical trees in an insulating member including a mica insulation applied to an electrical conductor, the method comprising: an assembly setting step of attaching an electrode setting assembly to outside of the mica insulation; an impregnation step of impregnating the mica insulation with synthetic resin after the assembly setting step; a removal step of removing components of the electrode setting assembly, except an electrode structure, after the impregnation step; a power supply connecting step of connecting, after the removal step, the electrical conductor and the electrode structure to a power supply in order to apply a voltage between the electrical conductor and the electrode structure; and a voltage applying step of applying a voltage between the electrical conductor and the electrode structure, after the power supply connecting step.

According to the present invention, there is provided an electrode structure for use in an electrical tree test method for testing electrical trees in an insulating member including a mica insulation applied to an electrical conductor, the structure comprising: a plate-like substrate which has electrical conductivity, and has a flat first surface and a flat second surface at the back of and parallel to the first surface; and a plurality of needle electrodes (22), which have electrical conductivity, are disposed on the first surface of the substrate, extend perpendicularly to the first surface of the substrate, and are disposed with intervals therebetween.

According to the present invention, there is provided an electrode setting assembly for setting conditions of reproducing electrical trees, comprising: an electrode structure described in any one of claims 4 to 8; a first electrode spacer shaped like a plate, having a flat first surface and a flat second surface parallel to and back of the flat first surface of the first electrode spacer, and having a thickness equal to that of the substrate, the thickness between the first and second surfaces being substantially equal to that of the substrate; a second electrode spacer shaped like a plate, having a flat first surface and a flat second surface parallel to and back of the flat first surface of the second electrode spacer, and having a thickness equal to that of the substrate, the thickness between the first and second surfaces being substantially equal to that of the substrate; and a holding plate having a first surface formed in a plane, wherein the second surface of the substrate of the electrode structure, the second surface of the first electrode spacer and the second surface of the second electrode spacer contact the first surface of the holding plate; and the first electrode spacer and the second electrode spacer are located oppose to each other in a planer direction sandwiching the substrate of the electrode structure therebetween.

Hereinafter, with reference to the accompanying drawings, an electrical tree test method, an electrode structure, and an electrode setting assembly will be described. The same or similar portions are represented by the same reference symbols and will not be described repeatedly.

Figure 1:
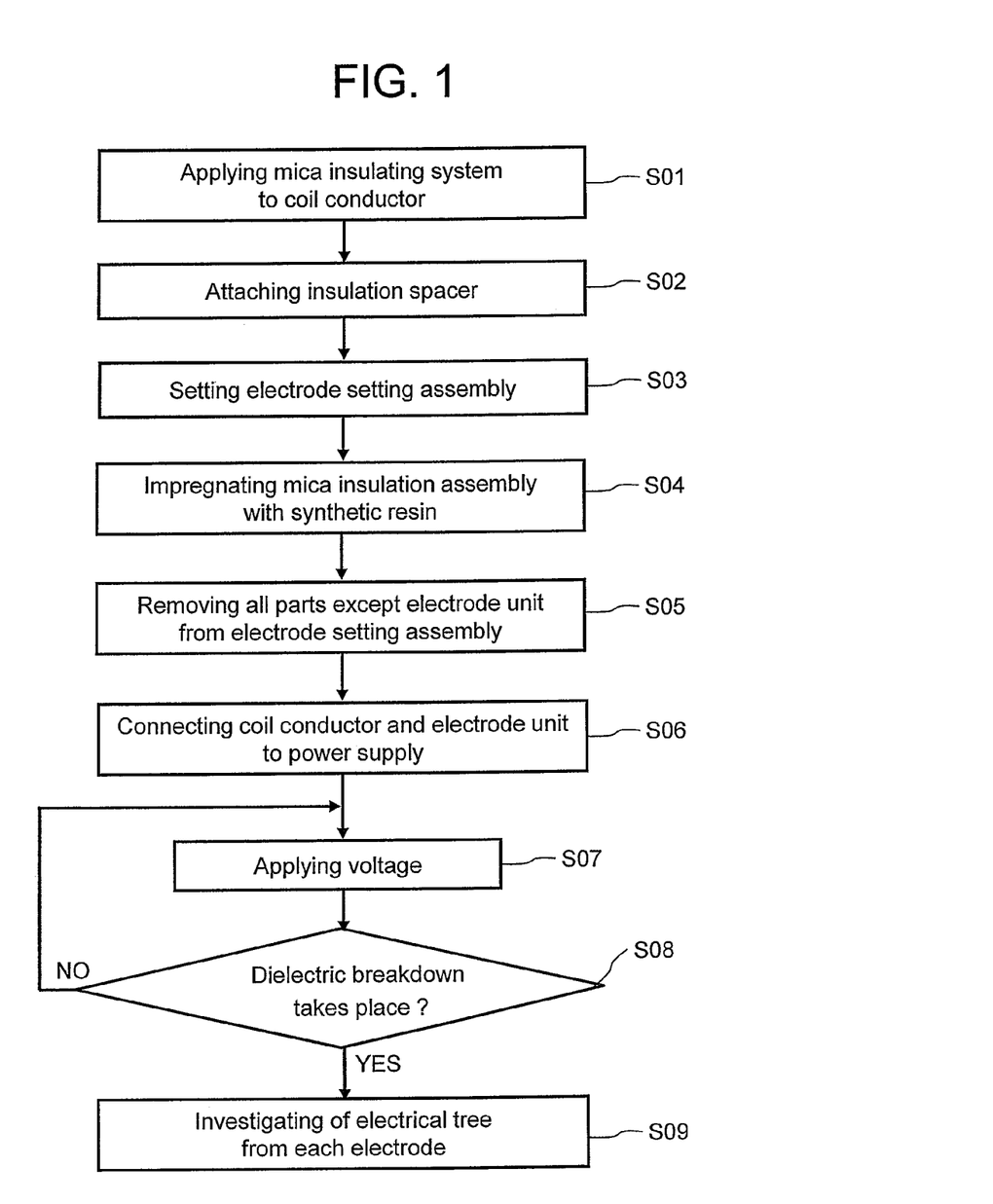
FIG. 1 is a flowchart showing the sequence of an electrical tree test method according to an embodiment.

FIG. 1 is a flowchart showing the sequence of an electrical tree test method according to an embodiment.

First, a mica insulating system is applied to, or insulating member including mica insulation is wound around a coil conductor 1 (see FIG. 8) that has a certain length and simulates a coil conductor of a rotating electrical machine, thereby electrically insulating the coil conductor 1 (Step S01).

Figure 2:
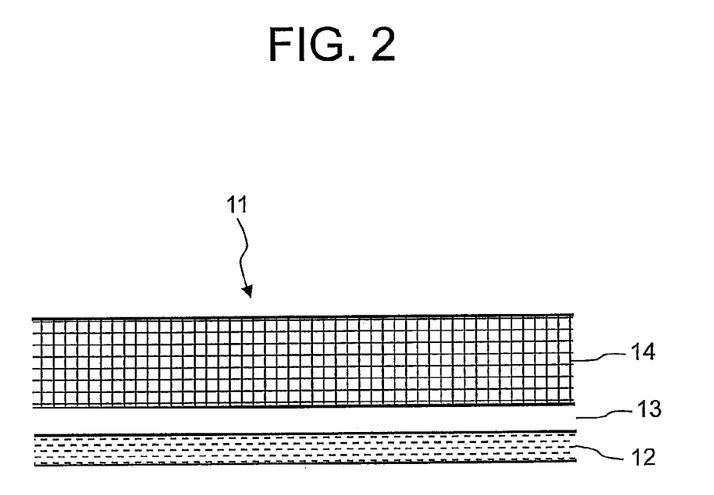
FIG. 2 is a sectional longitudinal view showing an exemplary configuration of a mica insulation tape for use in rotating electrical machines.

FIG. 2 is a sectional longitudinal view showing an exemplary configuration of a mica insulation tape for use in rotating electrical machines. The mica insulation tape 11 constituting a mica insulation system 10 includes a glass cloth part 12, a mica part 14, and an epoxy part 13 interposed between the glass cloth part 12 and the mica part 14. The mica part 14 has a thickness of, for example, about 0.1 mm. The glass cloth part 12 is thinner than the mica part 14, having a thickness of, for example, about 0.03 mm. In FIG. 2, the glass cloth part 12, epoxy part 13 and mica part 14, are illustrated as distinct members of the mica insulation tape 11 for simplicity. However, the epoxy part 13 has no thickness since it is impregnated in the glass cloth part 12 and mica part 14. That is, the glass cloth part 12 and the mica part 14 usually contact each other.

Figure 3:
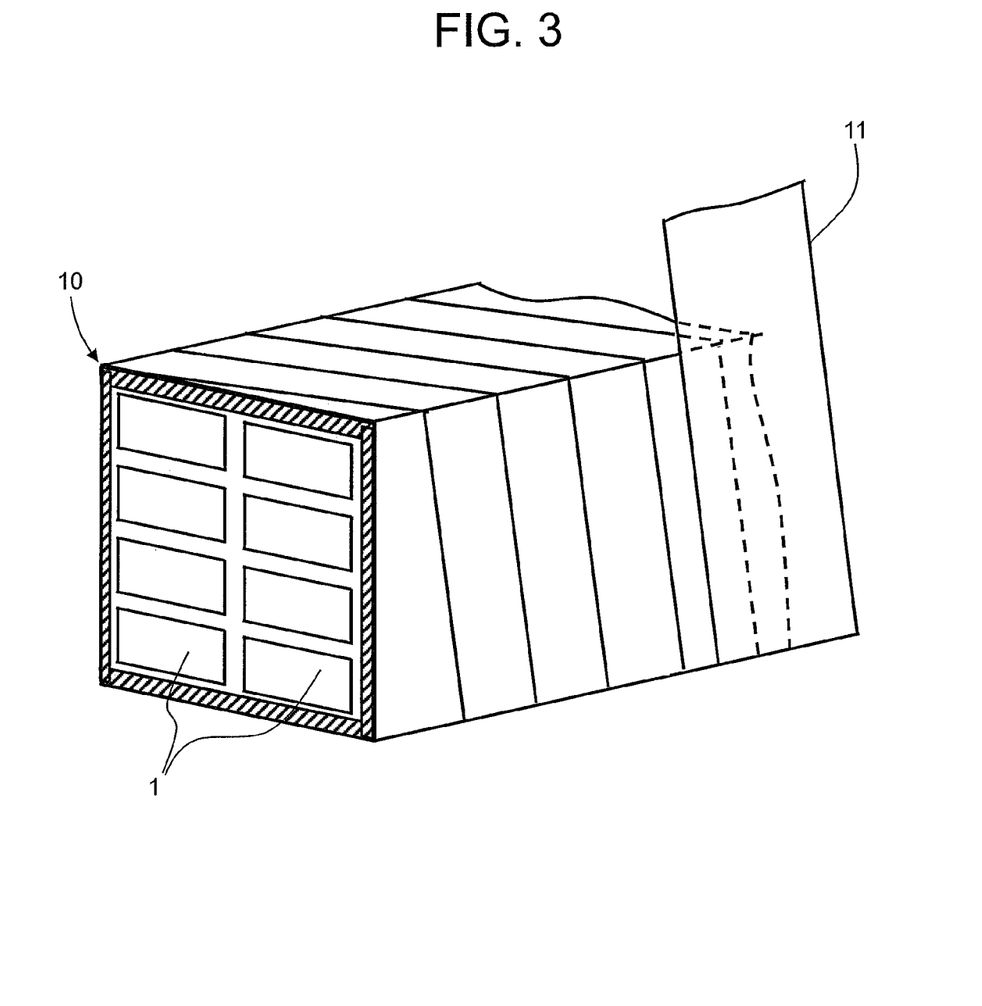
FIG. 3 is a perspective view illustrating the configuration of coil conductors for use in rotating electrical machines.

FIG. 3 is a perspective view illustrating the configuration of coil conductors for use in rotating electrical machines. FIG. 3 shows a case that eight coil conductors 1 are bundled together. A turn-insulation is wound around each of coil conductors 1. The mica insulation tape 11 is wound around the bundle of eight coil conductors 1 as major insulation, whereby a mica insulation system 10 is constituted.

In the mica insulation system 10, the mica insulation tape 11 is wound helically as viewed in a lengthwise direction of the coil conductors 1. The pitch at which the mica insulation tape 11 is wound helically is, for example, half the width of the mica insulation tape 11. Each turn of the mica insulation tape 11 therefore overlaps half of the width of the next turn. After so wound around the coil conductors 1 in the lengthwise direction of the coil conductors 1, the mica insulation tape 11 is again wound around the coil conductors 1, over the mica insulation tape 11 already wound. As a result, the mica insulation tape 11 forms a plurality of layers.

Each coil conductor 1 may first undergo an insulating process and may then undergo mica insulating process in some cases. In such a case, the individually insulated coil conductors may be merely referred to as "coil conductor 1."

Figure 4:
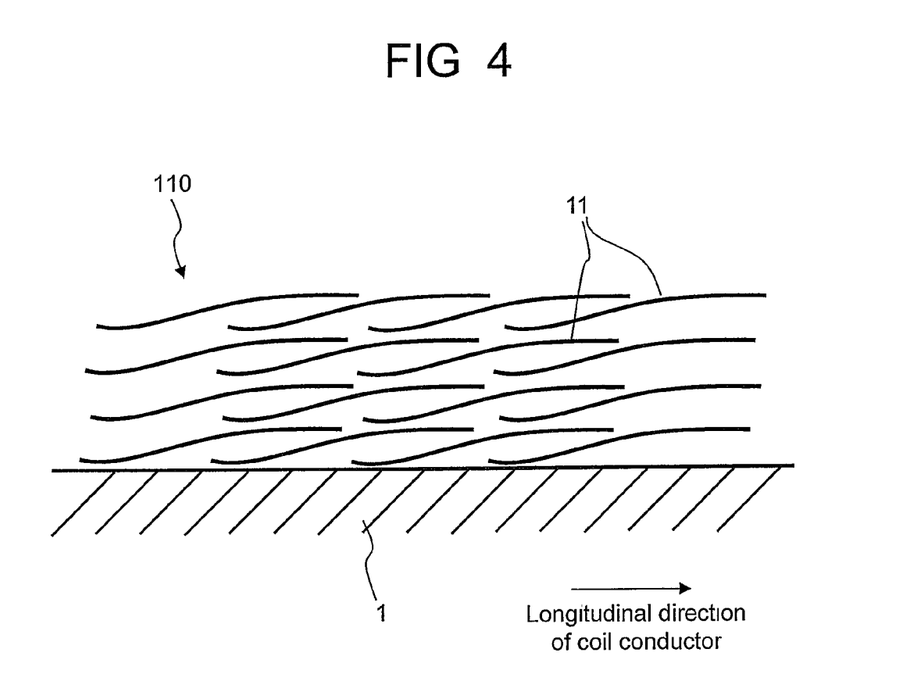
FIG. 4 is a sectional longitudinal view illustrating an exemplary method of winding the mica insulation tapes around a coil conductor.

FIG. 4 is a sectional longitudinal view illustrating an exemplary method of winding the mica insulation tapes around a coil conductor. FIG. 4 shows the longitudinal section of the surface part of the coil conductor 1 around which the mica insulation tape 11 is wound. In FIG. 4, each curve represents the cross section of one mica insulation tape 11. As has been specified above, the mica insulation tape 11 shifts by half its width in the lengthwise direction of the coil conductor 1.

FIG. 4 shows the case where the mica insulation tape 11 is wound four times around the coil conductor 1. In many cases, the mica insulation tape 11 is wound around the coil conductor 1, several times or tens of times, forming several layers or tens of layers. Hereinafter, the layers of mica insulation tape 11, formed around the coil conductor 1, will be referred to as "a mica insulation assembly 110", and the assembly 110 impregnated with synthetic resin will be referred to as "a mica insulation system 10."

Figure 5:
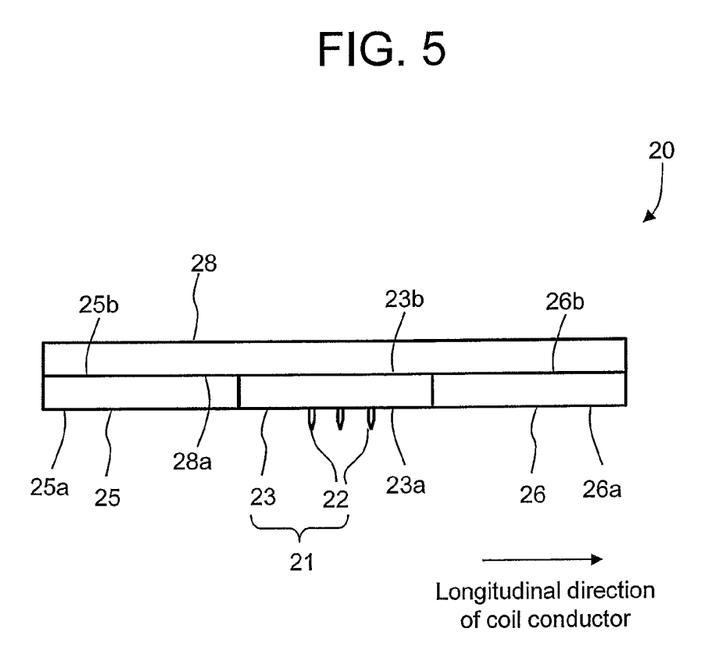
FIG. 5 is a front view illustrating the configuration of an electrode setting assembly according to the embodiment.
Figure 6:
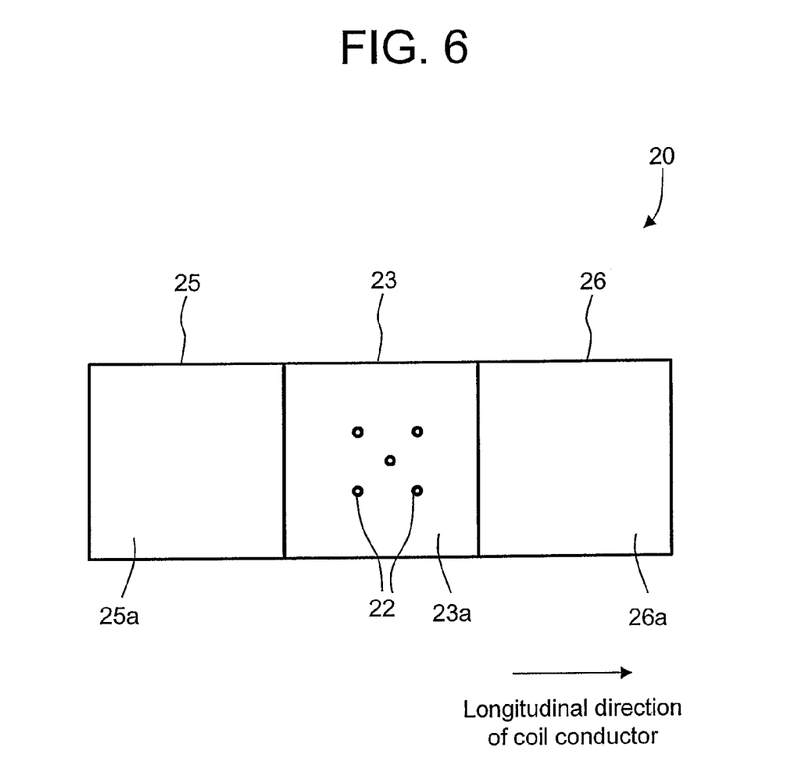
FIG. 6 is a bottom view illustrating the configuration of an electrode setting assembly according to the embodiment.

FIG. 5 is a front view illustrating the configuration of an electrode setting assembly according to the embodiment. FIG. 6 is a bottom view illustrating the configuration of an electrode setting assembly according to the embodiment. The electrode setting assembly 20 has an electrode unit 21, a first electrode spacer 25, a second electrode spacer 26, and a holding plate 28. The electrode unit 21 has a substrate 23 and a plurality of needle electrodes 22 attached on the substrate 23. The substrate 23 and the electrodes 22 have electrical conductivity.

The substrate 23, first electrode spacer 25, second electrode spacer 26 and holding plate 28 are rectangular flat plates. The first electrode spacer 25 and the second electrode spacer 26 are arranged at both axial sides of the substrate 23.

The substrate 23 has a first surface 23a and a second surface 23b at the back side of the first surface 23a. The first surface 23a and the second surface 23b are flat and parallel to each other. The first electrode spacer 25 has a first surface 25a and a second surface 25b at the back side of the first surface 25a. The first surface 25a and the second surface 25b are flat and parallel to each other. Similarly, the second electrode spacer 26 has a first surface 26a and a second surface 26b at the back side of the first surface 26a. The first surface 26a and the second surface 26b are flat and parallel to each other.

The first electrode spacer 25 is formed so that the distance between the first surface 25a and the second surface 25b, i.e., thickness of the first electrode spacer 25, is equal to the thickness of the substrate 23. Similarly, the second electrode spacer 26 is formed so that the thickness is equal to the thickness of the substrate 23.

The holding plate 28 has a first surface 28a formed to be flat.

The second surface 23b of the substrate 23 is arranged so as to contact the first surface 28a of the holding plate 28. The second surface 25b of the first electrode spacer 25 and the second surface 26b of the second electrode spacer 26 are arranged so as to contact the first surface 28a of the holding plate 28.

A mold release agent is coated on those surfaces of the substrate 23, first electrode spacer 25, second electrode spacer 26 and holding plate 28, where the substrate 23, first electrode spacer 25, the second electrode spacer 26 and the holding plate 28 contact one another. Further, the mold release agent is coated on the outer surfaces of the electrode setting assembly 20 except the first surface 23a of the substrate 23. Since the mold release agent is so coated, the substrate 23, first electrode spacer 25, second electrode spacer 26 and holding plate 28 can be removed easily from one another.

One of the needle electrodes 22 is disposed at an almost center part of the first surface 23a of the substrate 23. The other needle electrodes 22 are located equidistantly around the center needle electrode 22 with circumferential intervals therebetween. As shown in FIG. 6, five needle electrodes 22 are used. Alternatively, less or more needle electrodes may be used provided that at least two are provided.

Figure 7:
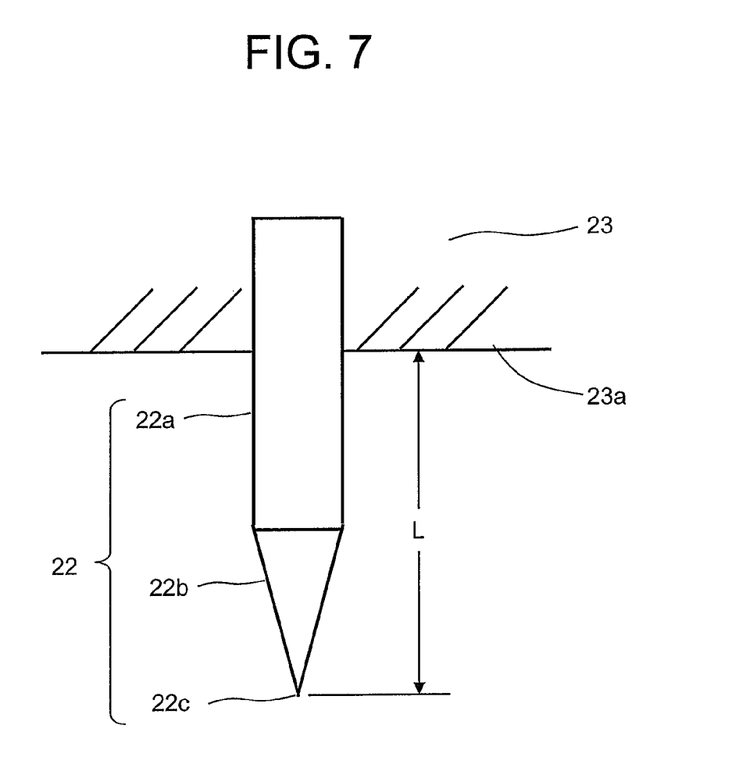
FIG. 7 is a sectional longitudinal view illustrating one of the needle electrodes used in the embodiment.

FIG. 7 is a sectional longitudinal view illustrating one of the needle electrodes used in the embodiment. As shown in FIG. 7, each needle electrode 22 has a columnar part 22a and a conical part 22b.

The columnar part 22a is shaped like a circular cylinder, extending in the perpendicular direction to the first surface 23a. One end of the columnar part 22a is buried in the substrate 23. A distal end 22c of each needle electrode 22 protrudes for distance L from the surface of the substrate 23.

The conical part 22b, which is shaped like a cone, is connected to the columnar part 22a at one end and extends coaxial with the columnar part 22a. The distal end 22c of the conical part 22b has a curvature radius of about 0.02 mm.

The columnar part 22a and the conical part 22b have a circular cross section as viewed in the axial direction. Their cross sections are not limited to a circular one. Alternatively, it may be, for example, a polygonal cross section or other shape.

As shown in FIG. 1, after Step S01 has been performed, an insulation spacer 18 (see FIG. 8) is attached to the surface of the coil conductor 1 (Step S02), in preparation for setting the electrode setting assembly 20 to the coil conductor 1.

Figure 8:
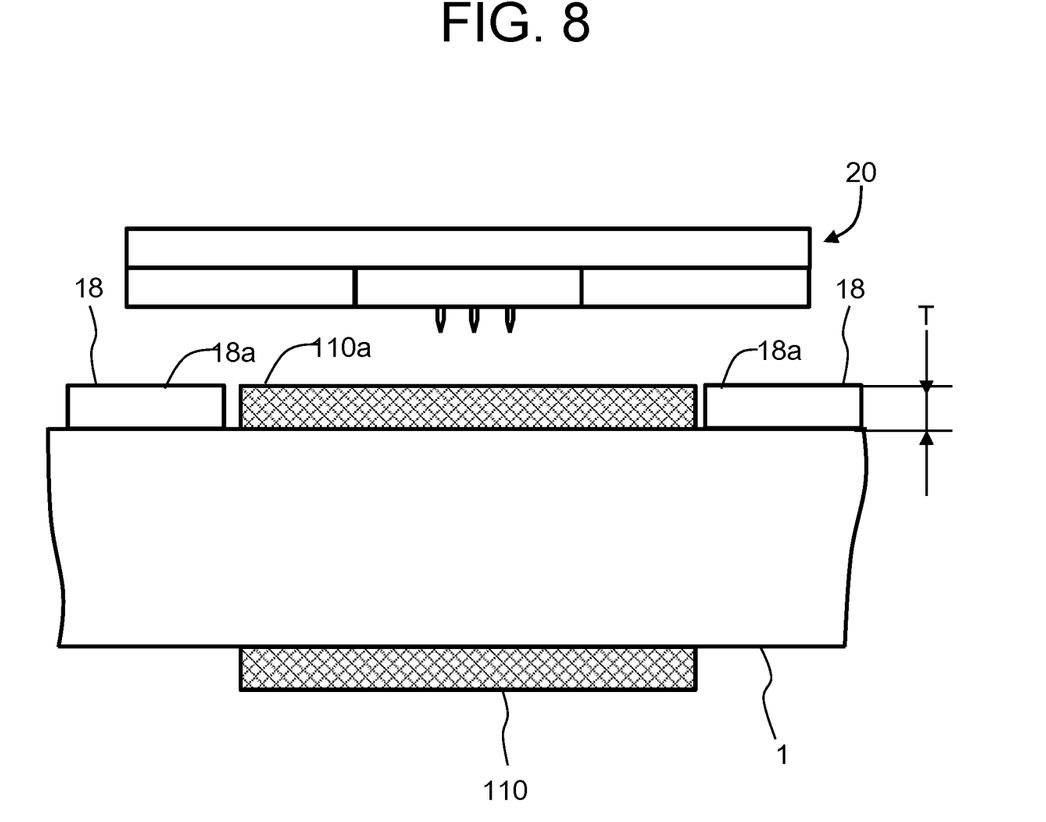
FIG. 8 is a sectional longitudinal view illustrating a state that the insulation spacer is attached to the coil conductor before the electrode setting assembly is attached in the electrical tree test method according the embodiment.

FIG. 8 is a sectional longitudinal view illustrating a state that the insulation spacer is attached to the coil conductor before the electrode setting assembly is attached in the electrical tree test method according the embodiment. Here, the thickness T of the insulation spacer 18 is the sum of a setting space D (see FIG. 10) and the length L of the needle electrodes 22 protruding from the substrate 23. It should be noted that the setting space D is the distance between the distal end 22c of each needle electrode 22 and the surface of the coil conductor 1 in the testing system (FIG. 10) to be described later.

After Step S02, the electrode setting assembly 20 is set to the outer surface 110a of the mica insulation assembly 110 (Step S03) as shown in FIG. 1.

Figure 9:
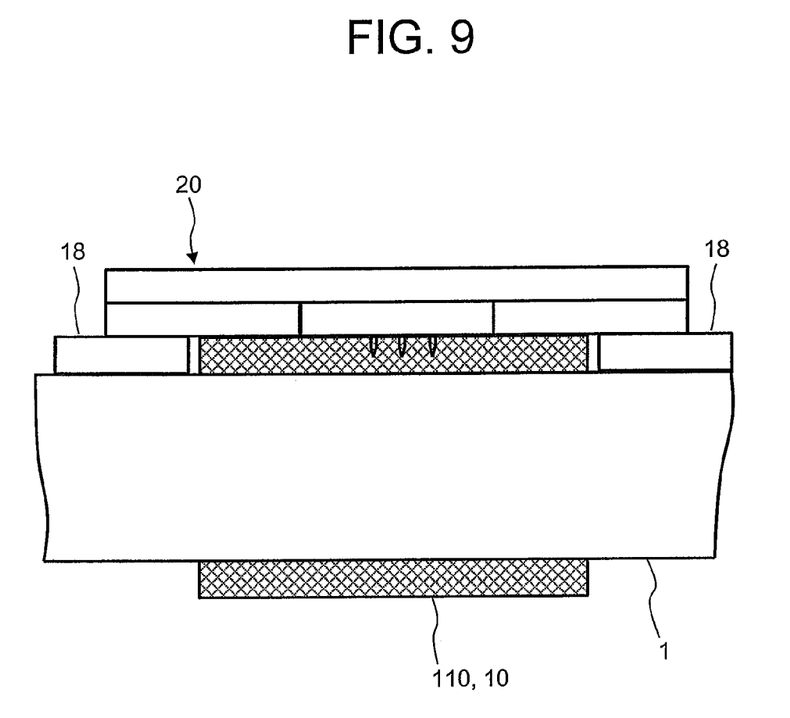
FIG. 9 is a sectional longitudinal view illustrating a state that the electrode setting assembly is attached to the coil conductor in the electrical tree test method according the embodiment.

FIG. 9 is a sectional longitudinal view illustrating a state that the electrode setting assembly is set to the coil conductor in the electrical tree test method according the embodiment. The insulation spacer 18 attached in Step S03 and the mica insulation assembly 110 set in this step have the same height as each other. Further, the electrode setting assembly 20 facing the mica insulation assembly 110 has a flat surface.

Therefore, no external forces are applied to the mica insulation assembly 110, except by insertion of the needle electrodes 22.

As a result, the needle electrodes 22 are inserted into the mica insulation assembly 110 for the distance equal to their height. Therefore, the distance from the distal end of each needle electrode 22 to the surface of the coil conductor 1 of the mica insulation assembly 110 has a value obtained by subtracting the height of the needle electrode. 22 from the height of the mica insulation assembly 110.

After Step S03, the mica insulation assembly is impregnated with synthetic resin (Step S04). The synthetic resin is injected by vacuum pressure impregnation (VPI). The mica insulation assembly in which the synthetic resin has been cured will be referred to as "mica insulation system 10."

As shown in FIG. 1, all parts, except the electrode unit 21, are removed from the electrode setting assembly 20 (Step S05) after Step S04. That is, the first electrode spacer 25, the second electrode spacer 26 and the holding plate 28 are removed from the electrode setting assembly 20. Since they are coated with the mold release agent, they can be easily removed without disturbing the position or posture of the electrode unit 21.

Figure 10:
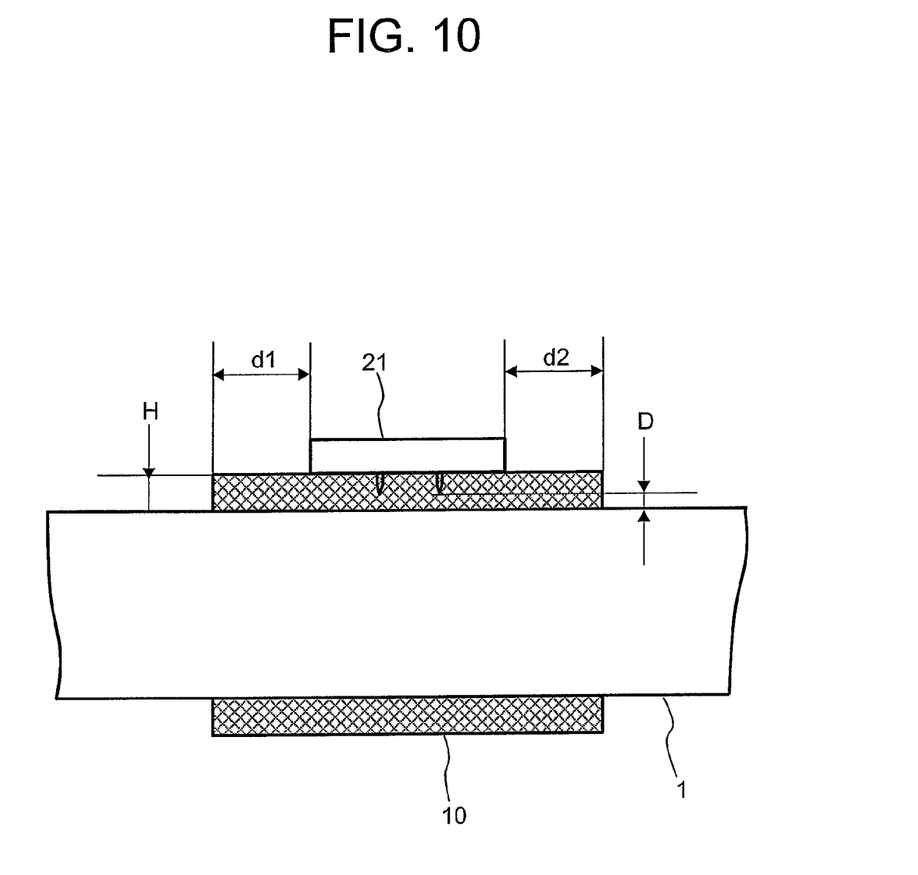
FIG. 10 is a sectional longitudinal view illustrating a state after the electrode setting assembly has been overhauled in the electrical tree test method according to the embodiment.

FIG. 10 is a sectional longitudinal view illustrating a state after the electrode setting assembly has been overhauled in the electrical tree test method according to the embodiment. The insulation spacer 18 has been also removed. Since the length L for which the needle electrodes 22 protrude from the surface of the substrate 23 has been already fixed, the distance D between the coil conductor 1 and the distal end 22c of the needle electrode 22 can be controlled desirably with high precision by adjusting thickness of the insulation spacer 18.

In this state, the substrate 23 of the electrode unit 21 must be shorter than the mica insulation system 10 as viewed in the lengthwise direction of the coil conductor 1. The difference in length between the substrate 23 and the mica insulation system 10 must be of such a value that creeping distances d1 and d2 between each of both ends of the substrate 23 and each of both ends of the mica insulation system 10 may be much greater than the linear distance from the tips of the needle electrodes to the coil conductor 1. That is, such cases that an electrical tree reaches the coil conductor 1 via surface of the substrate before it penetrates the mica insulation system 10 must be prevented.

Therefore, the creeping distances d1 and d2 should be long, for example, twice or more the height H of the mica insulation system 10.

After Step S05, the coil conductor 1 and the electrode unit 21 are connected to a power supply (Step S06).

Figure 11:
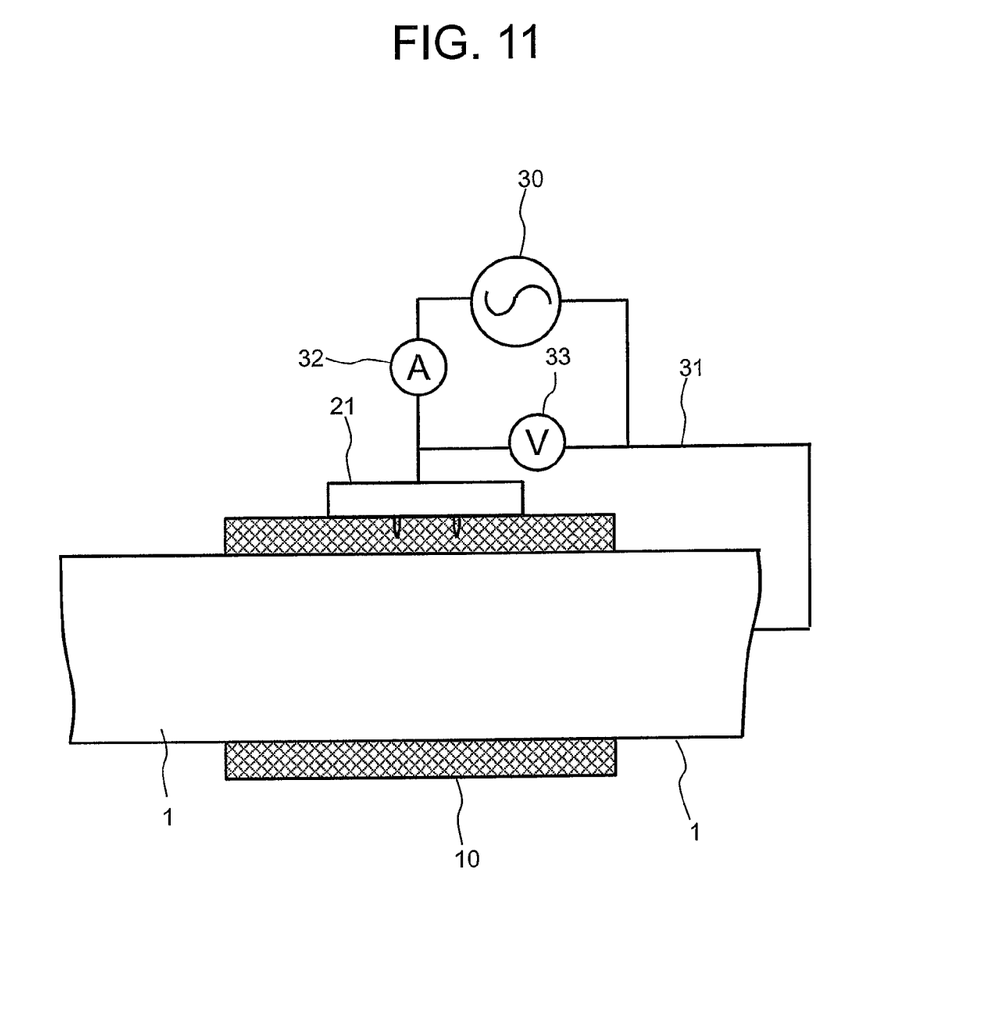
FIG. 11 is a sectional longitudinal view illustrating a state that the coil conductor and the electrode unit are connected to the power supply after the electrode setting assembly has been overhauled in the electrical tree test method according to the embodiment.

FIG. 11 is a sectional longitudinal view illustrating a state that the coil conductor and the electrode unit are connected to the power supply after the electrode setting assembly has been overhauled in the electrical tree test method according to the embodiment. FIG. 11 shows the case where the system is connected to an AC power supply 30. The mica insulation system 10 may be connected to a DC power supply. Alternatively, the system may be connected to a DC power supply and the connection may be controlled with an on/off switch.

After Step S06, a voltage is applied to the system (Step S07). It will be then kept monitored whether a dielectric breakdown takes place (Step S0S). In order to determine this, an ampere meter 32 and a voltmeter 33 are provided in the circuit 31. If a dielectric breakdown takes place, the output of the ampere meter 32 will abruptly increase and the output of the voltmeter 33 will abruptly decreases. The dielectric breakdown can therefore be monitored based on the outputs of the ampere meter 32 and voltmeter 33.

If no dielectric breakdown has occurred (NO in Step S08), the process of testing electrical trees returns to Step S07 and the monitoring of dielectric breakdown is continued. If dielectric breakdown has occurred (YES in Step S08), the mica insulation system 10 is removed, and it is investigated how electrical trees are developing from each of the electrodes (Step S09).

As described above, electrodes shaped like needles are used in the present embodiment, the points where electrical trees have started can be determined clearly. Further, providing a plurality of needle electrodes makes it possible to investigate how electrical trees develop at the parts where dielectric break down has not occurred.

Furthermore, since the needle electrodes are positioned, with their distal ends spaced from the coil conductor 1 by the same distance, factors of electrical tree development other than the distance can be investigated.

As has been described, the behavior of the electrical trees in the mica insulation system including the mica insulation can be reproduced, and the behavior of the electrical trees can be determined.

Other Embodiments

The present invention is described above by way of the embodiment. However, the embodiment is presented only as an example without any intention of limiting the scope of the present invention. For example, although a testing of a mica insulation system for a coil conductor of a rotating electrical machine is exemplified in the above embodiment, the present invention may be applied also to that for a coil conductor of general use.

Furthermore, the above-described embodiments may be put to use in various different ways and, if appropriate, any of the components thereof may be omitted, replaced or altered in various different ways without departing from the spirit and scope of the invention.

Therefore, all the above-described embodiments and the modifications made to them are within the spirit and scope of the present invention, which is specifically defined by the appended claims, as well as their equivalents.

What is claimed is:

1. An electrical tree test method of testing for electrical trees in an insulating member including a mica insulation applied to an electrical conductor, the method comprising:
an assembly setting step of attaching an electrode setting assembly to outside of the mica insulation;
an impregnation step of impregnating the mica insulation with synthetic resin after the assembly setting step;
a removal step of removing components of the electrode setting assembly, except an electrode structure, after the impregnation step;
a power supply connecting step of connecting, after the removal step, the electrical conductor and the electrode structure to a power supply in order to apply a voltage between the electrical conductor and the electrode structure; and
a voltage applying step of applying a voltage between the electrical conductor and the electrode structure, after the power supply connecting step.

2. The electrical tree test method according to claim 1, further comprising:
a dielectric-breakdown monitoring step of monitoring whether a dielectric breakdown occurs while the voltage is applied after the voltage applying step; and
an electrical-tree investigating step of investigating electrical trees if a dielectric breakdown is confirmed in the dielectric-breakdown monitoring step.

3. The electrical tree test method according to claim 2, wherein the electrical-tree investigating step includes a tree-developing determining step for determining how electrical trees have developed at electrodes other than the electrodes that have caused the dielectric breakdown.

4. An electrode structure for use in an electrical tree test method for testing electrical trees in an insulating member including a mica insulation applied to an electrical conductor, the structure comprising:
a plate-like substrate which has electrical conductivity, and has a flat first surface and a flat second surface at the back of and parallel to the first surface; and
a plurality of needle electrodes, which have electrical conductivity, are disposed on the first surface of the substrate, extend perpendicularly to the first surface of the substrate, and are disposed with intervals therebetween,
wherein
the needle electrodes include:
a first needle electrode arranged on the first surface of the substrate, substantially at the center of the first surface; and
second needle electrodes arranged at the same distance from the first needle electrode with circumferential intervals therebetween around the first needle electrode.

5. An electrode setting assembly for setting conditions of reproducing electrical trees, comprising:
an electrode structure;
a first electrode spacer shaped like a plate, having a flat first surface and a flat second surface parallel to and back of the flat first surface of the first electrode spacer, and having a thickness equal to that of the substrate, the thickness between the first and second surfaces of the first electrode spacer being substantially equal to that of the substrate;
a second electrode spacer shaped like a plate, having a flat first surface and a flat second surface parallel to and back of the flat first surface of the second electrode spacer, and having a thickness equal to that of the substrate, the thickness between the first and second surfaces of the second electrode spacer being substantially equal to that of the substrate; and
a holding plate having a first surface formed in a plane, wherein
the electrode structure includes
a plate-like substrate which has electrical conductivity, and has a flat first surface and a flat second surface at the back of and parallel to the first surface; and
a plurality of needle electrodes, which have electrical conductivity, are disposed on the first surface of the substrate, extend perpendicularly to the first surface of the substrate, and are disposed with intervals therebetween,
the second surface of the substrate of the electrode structure, the second surface of the first electrode spacer and the second surface of the second electrode spacer contact the first surface of the holding plate; and the first electrode spacer and the second electrode spacer are located oppose to each other in a planer direction sandwiching the substrate of the electrode structure therebetween.

6. The electrode setting assembly according to claim 5, wherein
a mold release agent is coated on those surfaces of the electrode structure, the first electrode spacer, the second electrode spacer and the holding plate, where they contact one another, and is coated on the first surface of the first electrode spacer and the first surface of the second electrode spacer, so that these components may easily be removed from one another.

7. The electrode setting assembly according to claim 5, wherein each of the flat first surfaces and the flat second surfaces of the first electrode spacer and second electrode spacer is rectangular.

\* \* \* \* \*